(12) United States Patent
Katscher et al.

(10) Patent No.: US 8,686,726 B2
(45) Date of Patent: Apr. 1, 2014

(54) RF SHIMMING WITH RF POWER REGULARIZATION USING A MULTI-CHANNEL RF TRANSMIT SYSTEM FOR MRI

(75) Inventors: Ulrich Katscher, Hamburg (DE); Ingmar Graesslin, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 355 days.

(21) Appl. No.: 13/063,477

(22) PCT Filed: Sep. 15, 2009

(86) PCT No.: PCT/IB2009/054014
§ 371 (c)(1),
(2), (4) Date: Mar. 11, 2011

(87) PCT Pub. No.: WO2010/032193
PCT Pub. Date: Mar. 25, 2010

(65) Prior Publication Data
US 2011/0163749 A1    Jul. 7, 2011

(30) Foreign Application Priority Data
Sep. 17, 2008   (EP) ..................................... 08164503

(51) Int. Cl.
*G01R 33/44* (2006.01)
(52) U.S. Cl.
USPC ............................ 324/307; 324/309; 600/410
(58) Field of Classification Search
USPC .................... 324/300–322; 382/131; 600/410
See application file for complete search history.

(56) References Cited

U.S. PATENT DOCUMENTS

2008/0129298 A1* 6/2008 Vaughan et al. ............... 324/322

OTHER PUBLICATIONS

J.V. Hajmal et al, "Initial Experience With RF Shimming at 3T Using a Whole Body 8 Channel RF System", Proc. Intl. Soc. Mag. Reson. Med., 16, May 2008, p. 496.
F. Wiesinger et al, "Evaluation of Parallel Transmit RF-Shimming Performance for 3 Tesla Whole-Body Imaging", Proc. Intl. Soc. Mag. Reson. Med. 15, 2007 p. 3352.
Z. Wang et all, "RF Shimming Considering Both Excitation Homogeneity and SAR", Proc. Intl. Soc. Mag. Reson. Med. 15, 2007, p. 1022.
U. Katscher et al, "Slab Selective, Regularized RF Shimming" Proc. Intl. Soc. Mag. Reson. Med. 17, April 2009, p. 2607.
B. Van Den Bergen et al, "The Effect of Body Size and Shape on RF Safety and B1 Field Homogeneity at 3T", Proc. Intl. Soc. Mag. Reson. Med 14, 2006, p. 2040.
D. Diehl et al, "B1 Homogenization At 3 T MRI Using a 16 Rung Transmit Array", Proc. Intl. Soc. Mag. Reson. Med. 13, 2005, p. 2751.
Ulrich Katscher et al, "Parallel RF Transmission in MRI", NMR in Biomedicine, Vol. 19, 2006, p. 393-400.

(Continued)

*Primary Examiner* — Melissa Koval
*Assistant Examiner* — Rishi Patel (57) ABSTRACT

A magnetic resonance system includes a magnetic resonance scanner having a multi-channel RF transmit system; an RF shimming processor configured to compute complex amplitude values for operative channels of the multi-channel RF transmit system based on a figure-of-merit including a weighted combination of a $B_1$ uniformity measure and a total power measure. An RF transmit sub-system is configured to drive the multi-channel RF transmit system to excite magnetic resonance using the complex amplitude values computed by the RF shimming processor for the operative channels of the multi-channel RF transmit system.

15 Claims, 3 Drawing Sheets

(56) References Cited

OTHER PUBLICATIONS

Yudong Zhu, "Parallel Excitation With an Array of Transmit Coils" Magnetic Resonance in Medicine, Vol. 51, Jan. 1, 2004, pp. 775-784.

Chun-Uy Yip et al, "Iterative RF Pulse Design for Vultidimensional, Small-Tip-Angle Selective Excitation" Magnetic Resonance in Medicine, Vol. 54, 2005, pp. 908-917.

Peter Ullmann, "Multiple-Channel RF Pulses and SAR Control", Proc. Intl. Soc. Mag. Reson. Med. 16, May 2008, 8 pages.

* cited by examiner

RF SHIMMING WITH RF POWER REGULARIZATION USING A MULTI-CHANNEL RF TRANSMIT SYSTEM FOR MRI

FIELD OF THE INVENTION

The following relates to the magnetic resonance arts, such as magnetic resonance imaging, magnetic resonance spectroscopy, and so forth.

BACKGROUND OF THE INVENTION

The magnetic resonance frequency scales with magnetic field. Accordingly, for high field magnetic resonance scanners, such as scanners with a static ($B_0$) magnetic field of about 3 Tesla or higher, the wavelength of magnetic resonance becomes sufficiently short that the homogeneity of the radio frequency (RF) excitation, sometimes denoted as the $B_1$ field, can become problematically inhomogeneous over a volume of interest.

A solution to this problem is to use a multi-transmit system, in which a plurality of transmit coils are operated independently. The transmit elements can be arranged as independently operable conductors of a "whole body" RF coil, or as local coils disposed on or proximate to the subject. By adjusting or shimming the relative RF power outputs of the transmit elements, the $B_1$ field uniformity can be enhanced.

The phase relations between various channels of a multi-channel transmit system can be arbitrary, leading to arbitrary electric field cancellation or enhancement inside a subject's body. Thus, the RF power absorbed by the subject can be significantly higher in a multi-transmit than in a single-transmit system. The power absorbed by the subject is typically quantified by a parameter known as the specific absorption rate (SAR). The SAR can be computed for the subject as a whole, or for a region of the subject, and can be computed as an average SAR or as a peak SAR. If not accounted for during RF shimming, the SAR may be larger than desired, or larger than acceptable for a given magnetic resonance procedure and/or for a given subject.

A known solution is to compute the SAR as a component of the RF shimming, and to optimize both the $B_1$ field homogeneity and the SAR simultaneously. However, computation of the SAR is computationally intensive, and typically entails modeling RF power absorption using a model of the subject including accurate information regarding electromagnetic characteristics of the organs and tissues of the subject (for a human or other biological subject). Such computationally intensive approaches are undesirable for practical applications such as diagnostic or clinical magnetic resonance imaging.

The following provides new and improved apparatuses and methods which overcome the above-referenced problems and others.

SUMMARY OF THE INVENTION

In accordance with one disclosed aspect, a magnetic resonance system comprises: a magnetic resonance scanner including a multi-channel RF transmit system; an RF shimming processor configured to compute complex amplitude values for operative channels of the multi-channel RF transmit system based on a figure-of-merit comprising a weighted combination of a $B_1$ uniformity measure and a total power measure; and an RF transmit sub-system configured to drive the multi-channel RF transmit system to excite magnetic resonance using the complex amplitude values computed by the RF shimming processor for the operative channels of the multi-channel RF transmit system.

In accordance with another disclosed aspect, a magnetic resonance method comprises: computing complex amplitude values for operative channels of a multi-channel RF transmit system based on a figure-of-merit comprising a weighted combination of a $B_1$ uniformity measure and a total power measure; generating magnetic resonance in a subject by driving the multi-channel RF transmit system to excite magnetic resonance using the computed complex amplitude values; and acquiring magnetic resonance data responsive to the generating.

In accordance with another disclosed aspect, a storage medium stores instructions executable to perform the magnetic resonance method as set forth in the immediately preceding paragraph.

In accordance with another disclosed aspect, an RF shimming system comprises: an RF shimming processor configured to compute complex amplitude values for operative channels of a multi-channel RF transmit system based on a figure-of-merit comprising a weighted combination of a $B_1$ uniformity measure and a total power measure; and a memory for storing the computed complex amplitude values, the memory being accessible by an RF transmit sub system of a magnetic resonance system to drive operative channels of the multi-channel RF transmit system at the computed complex amplitude values.

One advantage resides in providing rapid RF shimming while providing limitation on the resultant SAR.

Another advantage resides in computationally efficient planning of a magnetic resonance procedure employing a multi-transmit RF system.

Further advantages will be apparent to those of ordinary skill in the art upon reading and understand the following detailed description.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

Corresponding reference numerals when used in the various figures represent corresponding elements in the figures.

DETAILED DESCRIPTION OF EMBODIMENTS

Figure 1:
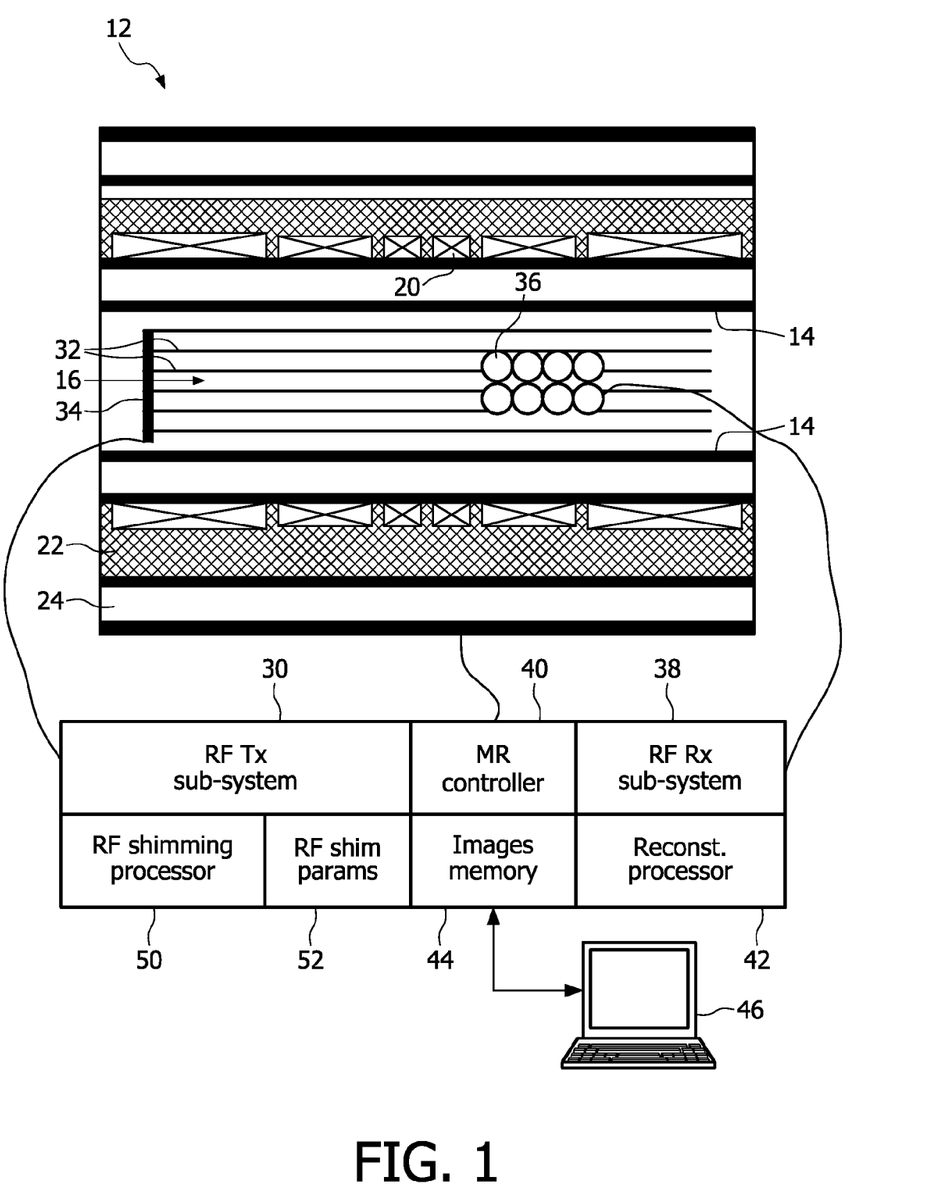
FIG. 1 diagrammatically shows an illustrative magnetic resonance system including an RF shimming processor.

With reference to FIG. 1, an illustrative magnetic resonance (MR) system includes a magnetic resonance scanner 12 which in the illustrated embodiment is a horizontal-bore type system having an annular housing with an inner cylindrical wall 14 surrounding and defining a generally cylindrical horizontally-oriented bore 16. The illustrated horizontal-bore type system is an example; the disclosed methods and apparatuses are compatible with substantially any type of magnetic resonance system. The magnetic resonance system includes superconducting magnet windings 20 arranged to generate a static ($B_0$) magnetic field oriented coaxially with the bore 16 at least in an examination region generally located at or near the center of the bore 16. For MR systems in which RF shimming is of interest, the static ($B_0$) magnetic field is typically about 3 Tesla or higher, although RF shimming can also be of advantage in lower field MR systems. To keep the superconducting magnet windings 20 below a critical temperature for superconduction at an electrical current effective to generate a desired static ($B_0$) magnetic field magnitude, the superconducting magnet windings 20 are immersed in liquid helium 22 that is in turn thermally isolated by a vacuum jacket 24.

The MR system further includes radio frequency (RF) components, namely: an RF transmit sub-system 30 driving a plurality of RF transmit channels which in the illustrated embodiment correspond to transmit elements 32 with the RF transmit sub-system 30 via a suitable RF power distribution network 34, to excite magnetic resonance in a subject; and a receive coil or (as illustrated) coil array 36 that receives a detected magnetic resonance signal that is processed by an RF receive sub-system 38 to generate magnetic resonance data. Although the illustrated RF power distribution network 34 is disposed inside or with the scanner 12, in other embodiments the RF power distribution network may be integrated into the RF transmit sub-system 30 or otherwise arranged. Moreover, instead of the illustrated rod-like transmit elements 32, the transmit elements may be surface coil loops or other local coil elements, or may each include a plurality of rods or coil loops, or may have other physical configurations.

A magnetic resonance controller 40 operates the RF transmit and receive sub-systems 30, 38 along with magnetic field gradient coils and associated controllers (not illustrated) to generate spatially encoded magnetic resonance data that is reconstructed by a reconstitution processor 42 based on the known spatial encoding and a suitable reconstruction algorithm (for example, a Fourier transform-based reconstruction algorithm suitable for reconstructing MR data having Cartesian space encoding) and the resulting images are stored in an images memory 44, displayed on a computer 46 or other suitable display device, transmitted via the Internet, printed, or otherwise utilized.

During a magnetic resonance (MR) procedure such as MR imaging or MR spectroscopy, some or all of the RF channels of the multi-channel RF transmit system 32, 34 are operative channels that are driven by the RF transmit sub-system 30 to excite magnetic resonance. To provide suitable nomenclature, the operative channels are identified by an index n, where n=1, ..., N. Typically, all channels of the multi-channel RF transmit system 32, 34 are operative channels; however, it is also contemplated for the N operative channels to be a sub-set of the channels of the multi-channel RF transmit system 32, 34.

A given operative channel n is characterized by a spatial transmit sensitivity distribution $T_n(x)$ which is in general a complex value indicative of both amplitude and phase of the $B_1$ field over a spatial volume of interest spanned by the spatial parameter x. Each operative channel n is driven by the RF transmit sub-system 30 to excite magnetic resonance at a complex amplitude value $A_n$. The complex amplitude values $A_n$, n=1, ..., N are generally complex values of the form $A_n=|A_n|\exp(i\phi_n)$. The spatial transmit sensitivity distribution of the N operative channels operating together is $$T_{tot}(x) = \sum_{n=1}^{N} A_n T_n(x).$$

It is desired to select the complex amplitude values $A_n$, n=1, ..., N to achieve a desired $B_1$ field uniformity as indicated by the uniformity of the total spatial transmit sensitivity distribution $T_{tot}(x)$.

With continuing reference to FIG. 1, toward this end an RF shimming processor 50 determines the complex amplitude values $A_n$, n=1, ..., N to achieve the desired $B_1$ field uniformity while simultaneously accounting for the total RF power. It is desired to achieve the desired $B_1$ field uniformity without unduly increasing the total RF power. In general, the total RF power can be characterized by the sum $$\sum_{n=1}^{N} A_n^2,$$

or by another sum of functions $f(A_n)$, n=1, ..., N which are generally indicative of RF power. The function $f(...)$ can be a square function leading to $$\sum_{n=1}^{N} A_n^2,$$

a quadratic or other polynomial function, or so forth. The RF shimming processor 50 is configured to compute the complex amplitude values $A_n$, n=1, ..., N for the N operative channels of the multi-channel RF transmit system 32, 34 based on a figure-of-merit comprising a weighted combination of a $B_1$ uniformity measure and a total power measure. The computed complex amplitude values are stored in an RF shim parameters memory 52 and are used by the RF transmit sub-system 30 in driving the N operative channels of the multi-channel RF transmit system 32, 34 during the MR procedure.

In some embodiments, the $B_1$ uniformity measure of the figure-of-merit comprises a sum of operative channel terms in which each operative channel term comprises the complex amplitude value $A_n$ for the channel multiplied by a spatial transmit sensitivity distribution $T_n(x)$ for the channel. In some embodiments, the total power measure comprises a sum of a function of the complex amplitude values, such as a sum of the complex amplitude values squared $$\sum_{n=1}^{N} A_n^2.$$

In some embodiments, the total power measure further comprises a normalization factor comprising an inverse of an expectation of a total spatial transmit sensitivity distribution of the operative channels of the multi-channel RF transmit system, such as $$\frac{1}{\langle T_{tot}(x) \rangle^2} \sum_{n=1}^{N} A_n^2.$$

In some embodiments, the figure-of-merit is of the form:

$$\delta = \langle (T_{tot}(x) - \langle T_{tot}(x) \rangle)^2 \rangle + \frac{\lambda}{\langle T_{tot}(x) \rangle^2} \sum_{n=1}^{N} A_n^2, \quad (1)$$

where spatial parameter x spans the volume of interest, $$T_{tot}(x) = \sum_{n=1}^{N} A_n T_n(x),$$

$T_n(x)$, n=1, ..., N denotes the spatial transmit sensitivity distributions of operative channels of the multi-channel RF transmit system, $\lambda$ is a weight parameter, and $A_n$, n=1, ..., N denotes the complex amplitude values for the operative channels of the multichannel RF transmit system. For example, the figure-of-merit can be written as:

$$\delta = (1-\lambda)\langle (T_{tot}(x) - \langle T_{tot}(x) \rangle)^2 \rangle + S \frac{\lambda}{\langle T_{tot}(x) \rangle^2} \sum_{n=1}^{N} A_n^2, \quad (2)$$

where the operator $\langle \ldots \rangle$ denotes a statistical average or expectation over the volume-of-interest, the weight parameter $\lambda$ is in a range [0,1] and S is a scaling factor in a range (0, ∞). In these figure-of-merit formulations, the weight parameter $\lambda$ denotes a trade-off between the measure of $B_1$ homogeneity, that is, $\langle (T_{tot}(x) - \langle T_{tot}(x) \rangle)^2 \rangle$, on the one hand, and the total power measure, that is, $$\frac{1}{\langle T_{tot}(x) \rangle^2} \sum_{n=1}^{N} A_n^2,$$

on the other hand. In the formulation of Equation (2), the scaling factor S is selected to ensure that the measure of $B_1$ homogeneity and the total power measure have comparable units or scales, so that the weight parameter $\lambda$ can assume a reasonable value to reflect the trade-off therebetween. Either Equation (1) or Equation (2) can be solved using a suitable iterative approach to find values of the complex amplitude parameters $A_n$, n=1, ..., N that minimize Equation (1) or Equation (2).

As used herein, the terms "minimize", "optimize" or the like are to be broadly construed as encompassing both an absolute minimum or optimum, or an approximate minimum or optimum such as might be obtained, for example, by an iterative optimization algorithm that is terminated before the absolute optimum is reached, or by an iterative minimization algorithm that settles on a local minimum that is larger than the global minimum of the function undergoing minimization.

The total power measure is not directly a measure of the specific absorption rate (SAR). However, fir SAR generally scales with the total power; accordingly, by including a regularized total power measure in the figure-of-merit employed by the RF shimming processor 50, the SAR is effectively taken into account during the RF shimming. This prevents the RF shimming from, for example, pushing the amplitude parameters $A_n$, n=1, ..., N to large values in order to enhance dynamic range to obtain a highly spatially uniform $B_1$ field over the volume of interest. Advantageously, the RF shimming figure-of-merit utilizing the total RF power measure for regularization, as disclosed herein, does not incorporate information about or representative of a subject to be imaged. Unlike SAR, the total forward RF power measure that is used for regularization is not dependent upon the subject, and accordingly does not incorporate information about or representative of a subject to be imaged.

Figure 2:
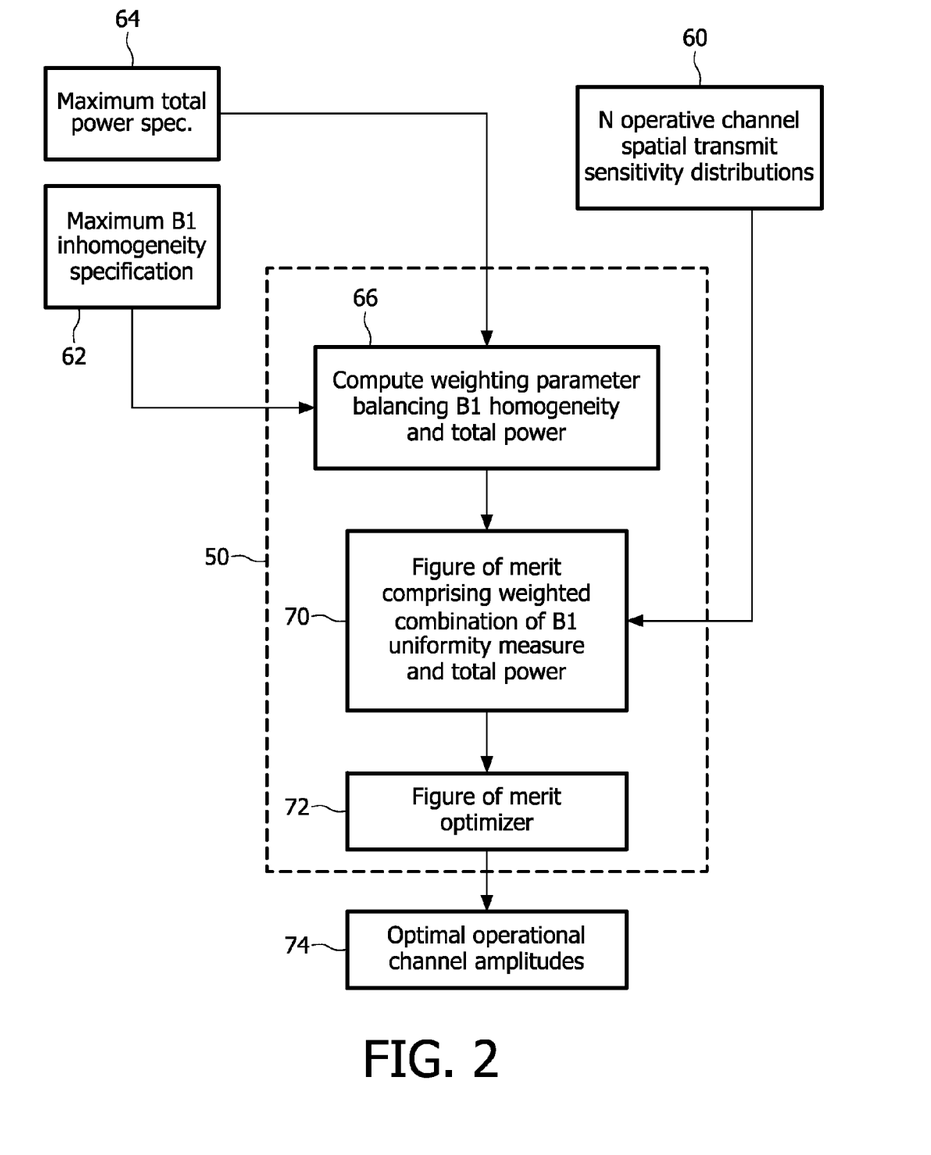
FIG. 2 diagrammatically shows illustrative operation of the RF shimming processor of FIG. 1.

With reference to FIG. 2, a suitable method performed by the RF shimming processor 50 is described. The inputs include the N operative channel spatial transmit sensitivity distributions $T_n(x)$, n=1, ..., N 60. These distributions may be approximated or obtained from various sources, such as empirically using suitable $B_1$ mapping MR procedures, from first principles based on electromagnetic modeling of the RF transmit elements 32, or so forth. Additional inputs include suitable constraints on the $B_1$ field uniformity and on the total RF power. These constraints may be specified, for example, by a maximum percent variation in $B_1$ across the volume of interest specification 62 and by a maximum total power specification 64. The weighting parameter $\lambda$ is computed 66 to balance the constraints 62, 64. The weighting parameter $\lambda$ can also be specified in other ways, such as directly (that is, for example, having the MR operator input a numerical value for $\lambda$) or by a qualitative graphical input, that is for example, having the MR operator position a slide input of a graphical user interface (GUI) displayed on the computer 46 or elsewhere, wherein the slide has one end labeled "maximize RF uniformity" or the like and the other (opposite) end labeled "minimize RF power", or so forth. A figure-of-merit 70 is constructed based on the specified weighting parameter $\lambda$ and the N operative channel spatial transmit sensitivity distributions $T_n(x)$, n=1, ..., N 60, for example in accordance with Equation (1), or in accordance with Equation (2), or so forth. A figure-of-merit optimizer 72 optimizes the figure-of-merit 70 to generate the optimal operative channel amplitudes $A_n$, n=1, ..., N 74 that are stored in the memory 52 and utilized by the RF transmit sub-system 30 of FIG. 1. For the illustrative figure-of-merit formulations of Equation (1) or Equation (2), the figure-of-merit optimizer 72 suitably minimizes the figure-of-merit; however, it is also contemplated to employ a figure-of-merit for which maximization reflects the optimal complex amplitude values, in which case the figure-of-merit optimizer suitably maximizes the figure-of-merit.

In a variant approach, the weighting parameter $\lambda$ is not specified precisely; rather, the figure-of-merit optimizer 72 optimizes the figure-of-merit 70 for various values of the weighting parameter $\lambda$ spanning a likely range of interest or spanning the full range that $\lambda$ can attain (e.g., the range [0,1] for the figure-of-merit of Equation (2)). The RF shimming processor 50 then suitably displays (on the computer 46, for example), for each different value of $\lambda$, the $B_1$ uniformity indicated by the optimized $B_1$ uniformity measure of the optimized figure-of-merit and the total RF power indicated by the optimized total power measure of the optimized figure-of-merit. The user can then select the value of $\lambda$ that yielded the most favorable (as judged by the human operator) $B_1$ uniformity/total power trade-off, and the corresponding optimized operative channel amplitudes $A_n$, n=1, ..., N for the selected value of $\lambda$ are stored in the memory 52 and utilized by the RF transmit sub-system 30. In another variation, the aforedescribed GUI slider is used, but if the figure-of-merit optimizer 72 is fast enough, the figure-of-merit can be constructed and optimized for each slider position the human operator selects so that the $B_1$ uniformity and the total RF power for each slider position can be displayed substantially in real-time.

Figure 3:
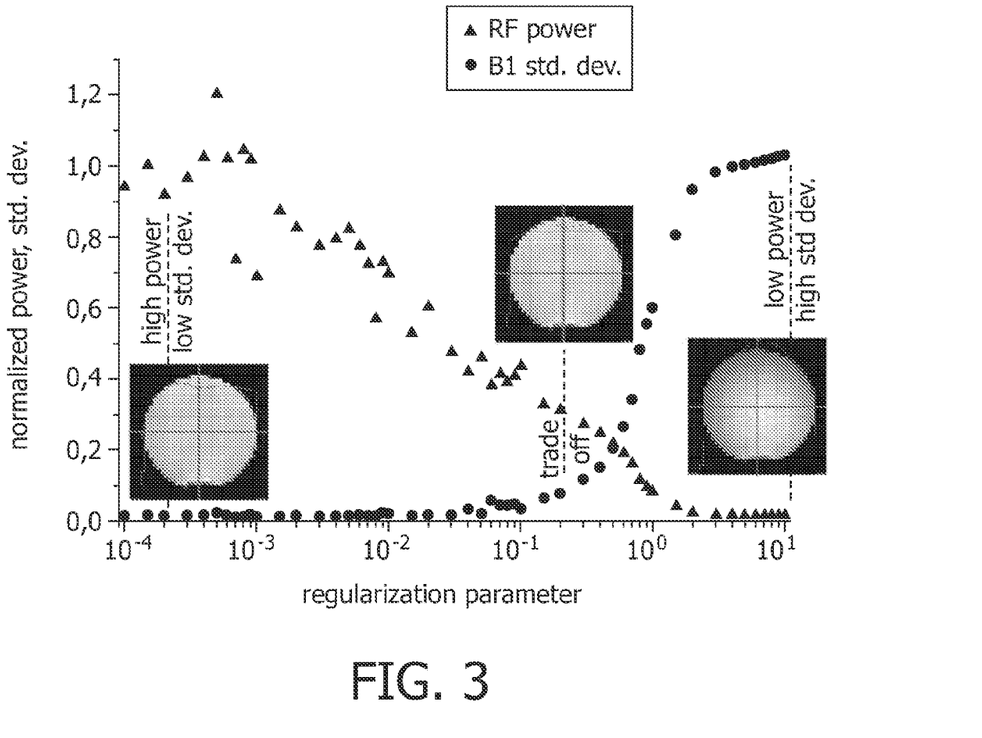
FIG. 3 plots experimental results obtained using RF shimming techniques disclosed herein.

With reference to FIG. 3, a trade-off is illustrated between $B_1$ homogeneity and total RF power, experimentally determined using a cylindrical water phantom in a whole body, 8-channel transmit/receive MR system at 3 T. Standard RF shimming without regularization (left hand side of the graph of FIG. 3, corresponding to setting $\lambda \sim 0$ in Equation (1) or Equation (2)) yields a low $B_1$ standard deviation (that is, high $B_1$ uniformity), but high RF power. On the other hand, a high regularization parameter (that is, setting $\lambda$ to a large value in Equation (1) or Equation (2) to emphasize the total RF power aspect) yields low RF power, but a poor B1 homogeneity, corresponding to the quadrature excitation mode (right hand side of the graph of FIG. 3). For the trade-off indicated in FIG. 3, the $B_1$ homogeneity is close to the optimum, while the total RF power is a factor of three lower than was the case for standard RF shimming.

The disclosed RF shimming methods including regularization can also be embodied as a storage medium storing instructions executable to perform the magnetic resonance method. Such a storage medium may include, for example: a magnetic disk; an optical disk; a FLASH memory or other electrostatic memory; a remote server storage accessed via a hospital network, the Internet, or another digital data network; a read-only memory (ROM); a random access memory (RAM); or so forth.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed embodiments can be implemented by means of hardware comprising several distinct elements, or by means of a combination of hardware and software. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A magnetic resonance system comprising:
a magnetic resonance scanner including a multi-channel radio frequency (RF) transmit system;
an RF shimming processor configured to compute complex amplitude values for operative channels of the multi-channel RF transmit system based on a figure-of-merit comprising a weighted combination of a $B_1$ uniformity measure and a total power measure; and
an RF transmit sub-system configured to drive the multi-channel RF transmit system to excite magnetic resonance using the complex amplitude values computed by the RF shimming processor for the operative channels of the multi-channel RF transmit system,
wherein the figure-of-merit comprising a weighted combination of the B1 uniformity measure and the total power measure is of a form of $$\delta = \langle (T_{tot}(x) - \langle T_{tot}(x) \rangle)^2 \rangle + \frac{\lambda}{\langle T_{tot}(x) \rangle^2} \sum_{n=1}^{N} A_n^2$$

where spatial parameter x spans the volume of interest, where operator $\langle \ldots \rangle$ denotes a statistical average or expectation over the volume-of-interest $$T_{tot}(x) = \sum_{n=1}^{N} A_n T_n(x),$$

$T_n(x)$, n=1, ..., N denotes the spatial transmit sensitivity distributions of operative channels of the multi-channel RF transmit system, $\lambda$ is a weight parameter, $A_n$, n=1, ..., N denotes the complex amplitude values for the operative channels of the multi-channel RF transmit system, n is an index of an operative channel, and N is a total number of the operative channels.

2. The magnetic resonance system as set forth in claim 1, wherein the B uniformity measure comprises a sum of operative channel terms in which each operative channel term comprises the complex amplitude value for the channel times a spatial transmit sensitivity distribution for the channel.

3. The magnetic resonance system as set forth in claim 1, wherein the total power measure comprises a sum of a function of the complex amplitude values.

4. The magnetic resonance system as set forth in claim 1, wherein the total power measure comprises a sum of the complex amplitude values squared.

5. The magnetic resonance system as set forth in claim 4, wherein the total power measure further comprises a normalization factor comprising an inverse of an expectation of a total spatial transmit sensitivity distribution of the operative channels of the multi-channel RF transmit system.

6. The magnetic resonance system as set forth in claim 1, wherein the figure-of-merit can be written as $$\delta = (1 - \lambda)\langle (T_{tot}(x) - \langle T_{tot}(x) \rangle)^2 \rangle + S\frac{\lambda}{\langle T_{tot}(x) \rangle^2} \sum_{n=1}^{N} A_n^2$$

where the weight parameter $\lambda$ is in a range [0,1] and S is a scaling factor in a range $(0, \infty)$.

7. The magnetic resonance system as set forth in claim 1, further comprising:
a reconstruction processor configured to reconstruct magnetic resonance data generated by the cooperating magnetic resonance scanner and RF transmit subsystem to generate a reconstructed image; and
a display device configured to display the reconstructed image.

8. A magnetic resonance method comprising:
computing complex amplitude values for operative channels of a multi-channel RF transmit system based on a figure-of-merit comprising a weighted combination of a $B_1$ uniformity measure and a total power measure;
generating magnetic resonance in a subject by driving the multi-channel RF transmit system to excite magnetic resonance using the computed complex amplitude values; and
acquiring magnetic resonance data responsive to the generating, wherein the figure-of-merit comprising a weighted combination of the $B_1$ uniformity measure and the total power measure is of the form of $$\delta = \langle (T_{tot}(x) - \langle T_{tot}(x)\rangle)^2\rangle + \frac{\lambda}{\langle T_{tot}(x)\rangle^2}\sum_{n=1}^{N} A_n^2$$

where spatial parameter x spans the volume of interest, where $\langle \ldots \rangle$ denotes a statistical average or expectation over the volume-of-interest, $$T_{tot}(x) = \sum_{n=1}^{N} A_n T_n(x),$$

$T_n(x)$, n=1, ..., N denotes the spatial transmit sensitivity distributions of operative channels of the multi-channel RF transmit system, $\lambda$ is a weight parameter, $A_n$, n=1, ..., N denotes the complex amplitude values for the operative channels of the multi-channel RF transmit system, n is an index of an operative channel, and N is a total number of the operative channels.

9. The magnetic resonance method as set forth in claim 8, further comprising the acts of:
reconstructing the magnetic resonance data to generate a reconstructed image; and
displaying the reconstructed image.

10. The magnetic resonance method as set forth in claim 8, wherein the $B_1$ uniformity measure comprises a sum of operative channel terms in which each operative channel term comprises the complex amplitude value for the channel times a spatial transmit sensitivity distribution for the channel, and the total power measure comprises at least one of a sum of a function of the complex amplitude values and a sum of the complex amplitude values squared.

11. The magnetic resonance method as set forth in claim 8, wherein the figure-of-merit can be written as $$\delta = (1-\lambda)\langle (T_{tot}(x) - \langle T_{tot}(x)\rangle)^2\rangle + S\frac{\lambda}{\langle T_{tot}(x)\rangle^2}\sum_{n=1}^{N} A_n^2$$

where the weight parameter $\lambda$ is in a range [0,1] and S is a scaling factor in a range (0, ∞).

12. A non-transitory computer readable medium storing instructions which, when executed by a processor, configure the processor to perform the acts of:
computing complex amplitude values for operative channels of a multi-channel radio frequency (RF) transmit system based on a figure-of-merit comprising a weighted combination of a $B_1$ uniformity measure and a total power measure;
generating magnetic resonance in a subject by driving the multi-channel RF transmit system to excite magnetic resonance using the computed complex amplitude values; and
acquiring magnetic resonance data responsive to the generating,
wherein the figure-of-merit comprising a weighted combination of the $B_1$ uniformity measure and the total power measure is of the form of $$\delta = \langle (T_{tot}(x) - \langle T_{tot}(x)\rangle)^2\rangle + \frac{\lambda}{\langle T_{tot}(x)\rangle^2}\sum_{n=1}^{N} A_n^2$$

where spatial parameter x spans the volume of interest, where operator $\langle \ldots \rangle$ denotes a statistical average or expectation over the volume-of-interest, $$T_{tot}(x) = \sum_{n=1}^{N} A_n T_n(x), T_n(x), n = 1, \ldots, N$$

denotes the spatial transmit sensitivity distributions of operative channels of the multi-channel RF transmit system, $\lambda$ is a weight parameter, $A_n$, n=1, ..., N denotes the complex amplitude values for the operative channels of the multi-channel RF transmit system, n is an index of an operative channel, and N is a total number of the operative channels.

13. A radio frequency (RF) shimming system comprising:
an RF shimming processor configured to compute complex amplitude values for operative channels of a multi-channel RF transmit system based on a figure-of-merit comprising a weighted combination of a B uniformity measure and a total power measure; and
a memory for storing the computed complex amplitude values, the memory being accessible by an RF transmit sub-system of a magnetic resonance system to drive operative channels of the multi-channel RF transmit system at the computed complex amplitude values,
wherein the figure-of-merit comprising a weighted combination of the $B_1$ uniformity measure and the total power measure is of the form of $$\delta = \langle (T_{tot}(x) - \langle T_{tot}(x)\rangle)^2\rangle + \frac{\lambda}{\langle T_{tot}(x)\rangle^2}\sum_{n=1}^{N} A_n^2$$

where spatial parameter x spans the volume of interest, where operator $\langle \ldots \rangle$ denotes a statistical average or expectation over the volume-of-interest, $$T_{tot}(x) = \sum_{n=1}^{N} A_n T_n(x),$$

$T_x(x)$, n=1, ... N denotes the spatial transmit sensitivity distributions of operative channels of the multi-channel RF transmit system, $\lambda$ is a weight parameter, $A_n$, n=1, ..., N denotes the complex amplitude values for the operative channels of the multi-channel RF transmit system, n is an index of an operative channel, and N is a total number of the operative channels.

14. The non-transitory computer readable medium of claim 12, wherein the figure-of-merit can be written as $$\delta = (1-\lambda)\langle (T_{tot}(x) - \langle T_{tot}(x)\rangle)^2\rangle + S\frac{\lambda}{\langle T_{tot}(x)\rangle^2}\sum_{n=1}^{N} A_n^2$$

where the weight parameter $\lambda$ is in a range [0,1] and S is a scaling factor in a range (0, ∞).

15. The RF shimming system of claim 13, wherein the figure-of-merit can be written as $$\delta = (1-\lambda)\langle (T_{tot}(x) - \langle T_{tot}(x)\rangle)^2\rangle + S\frac{\lambda}{\langle T_{tot}(x)\rangle^2}\sum_{n=1}^{N} A_n^2$$

where the weight parameter $\lambda$ is in a range $[0,1]$ and S is a scaling factor in a range $(0, \infty)$.

* * * * *